United States Patent [19]

Slabinski et al.

[11] Patent Number: 5,040,640

[45] Date of Patent: Aug. 20, 1991

[54] PIEZORESISTIVE ELEVATOR BUTTON

[75] Inventors: Chester J. Slabinski, New Hartford; Robert B. Leach, New Britain, both of Conn.

[73] Assignee: Otis Elevator Company, Farmington, Conn.

[21] Appl. No.: 554,485

[22] Filed: Jul. 19, 1990

[51] Int. Cl.⁵ ............................................. B66B 3/00
[52] U.S. Cl. ................................................. 187/121
[58] Field of Search ...................... 187/121; 310/311; 338/3

[56] References Cited

U.S. PATENT DOCUMENTS

| 4,166,269 | 8/1979 | Stephens et al. | 338/3 |
| 4,419,598 | 12/1983 | Spitz et al. | 310/311 |
| 4,805,739 | 2/1989 | Lind et al. | 187/121 |

Primary Examiner—A. D. Pellinen
Assistant Examiner—Lawrence E. Colbert
Attorney, Agent, or Firm—Breffni X. Baggot

[57] ABSTRACT

A piezoresistive elevator button assembly comprises a polymer film piezoresistive element sandwiched between a button and a button pressure plate, and circuitry for sensing a change in the resistance of the piezoresistive element. The piezoresistive element is held in place by a high temperature potting compound to create a button less sensitive to fire or heat. A compensating spring is placed between the piezoresistive element and the buttom pressure plate to eliminate the effect on that element due to temperature cycling of the button assembly elements. A frustoconical housing of the button employing catch teeth allows for little movement; the use of the polymer film piezoresistive element allows a signal to be generated though buttom movement is nearly imperceptible.

6 Claims, 1 Drawing Sheet

PIEZORESISTIVE ELEVATOR BUTTON

TECHNICAL FILED

This invention relates to an improved elevator button assembly using a polymer film piezoresistive element to sense activation of the button. The button assembly is resistant to heat or flame induced malfunction, compact, using a minimum number of parts and readily capable of digital processing. Use of a polymer film allows for a button assembly that senses change in resistance through button movement which is imperceptible to humans.

BACKGROUND ART

It is desirable that an elevator button have a number of characteristics not required in other buttons. Such a button must be able to withstand a greater impact force because the average passenger often does not push an elevator button, but rather he/she strikes it. A vandal may strike it even harder. Second, elevator buttons must be resistant to heat so that they are not damaged in a fire nor register calls in a fire. They must be similarly unresponsive to flame. Finally, it is desirable, both for aesthetic reasons and functional reasons that the button not have perceptible motion to register a call for service. An elevator button with no moving mechanical parts will be less likely to be subject to the need for repair.

Three are two types of piezoelements commonly used for pushbuttons: piezoresistive and piezoelectric.

Buttons using a piezoelectric element are based on the piezoelectric effect, i.e., the material in the button generates a voltage potential when subjected to pressure. Such a button is disclosed in U.S. Pat. No. 4,805,739, "Elevator Control Switch and Position Indicator Assembly", by Lind et al, issued Feb. 21, 1989. Buttons incorporating piezoresistive elements use the fact that the resistivity of the piezoelement changes with pressure.

One problem with piezoelectric materials is that they are brittle, a characteristic wholly unsuited to elevator buttons because of the daily rigors to which they are subjected. Such buttons are defenseless against vandals. The brittleness of piezoelectric materials lends them to being easily shattered.

A second problem with piezoelectric buttons is that they produce an output signal that is difficult to process with digital circuitry. The output of the piezoelectric element, when subjected to a flat load curve such as a step function, is a signal similar to the output from a high past filter where the time constant is much smaller than the time period of an input step function. Third, piezoelectrics are particularly sensitive to damage in a fire due to their heat sensitivity.

Attempts have been made to produce an elevator button with the desirable qualities mentioned above. Such an attempt is found in "Pathless Piezobuttons For Industrial Applications", components report 14 (1975) No. 5, which displays a piezoceramic film utilizing the piezoelectric effect. In the reference, the travel involved by the finger pressure is less than 1 micrometer. Hence, the name "pathless". The piezoelectric material in this button does not have the inherent temperature resistant characteristics needed for an elevator button. It therefore requires a flame-protective material for the button housing in order to overcome this deficiency. The reference discloses a piezoelectric member located perpendicular to the button face and a button backing having support members which secure the element vertically.

Other buttons similarly are unable to meet the needs of elevator systems. U.S. Pat. No. 4,267,725 discloses a vertical piezoresistive element braced at its center by a set screw such that depression of the button face at the upper tip of the element, and transverse to it, causes the element to generate a signal proportional to bending of the element. The set screw serves to ensure that the bending is only in one direction. This button fails to fulfill the need for a button with no observable mechanical movement since the button face of the reference must descend in order for the piezoelement to bend and thus give a signal. The nature of thin film silicon is such that a large amount of deformation is required to change the resistance of the element significantly enough that it can be measured. Such deformation is achieved, with the least amount of force, by bowing the element; it could not be so easily achieved by applying pressure transverse to the element on a flat surface. The reference requires a large number of complexly interrelated moving parts because there is no allowance to choose not to bow. Accordingly, this design is undesirable.

In another button, disclosed in U.S. Pat. No. 4,644,315, a cantilevered piezoresistive element is used. In one embodiment the cantilevered element is vertical while in another the cantilevered element is horizontal. This reference discloses a donut-shaped magnet connected to a plunger on a button face such that the magnet descends with the button face to deflect an oppositely-poled magnet mounted on the tip of a cantilever having a piezoresistor hinge. This button, however, does not meet the need for an elevator button having no mechanical movement. Further, the use of the magnet/hinge apparatus and the need to position the magnet/hinge assembly with great precision make for a button that is costly. The same factors make it likely to be difficult to manufacture insofar as setting the magnet/hinge arrangement such that it interferes with the donut-shaped magnet so much as to sense its movement, but not so much as to be directly in the path of the donut-shaped magnet to as it descent. Also, this reference does not achieve a signal output readily susceptible of processing through digital circuitry. The second embodiment shows the cantilever mounted in horizontal fashion. This tends to produce more equal forces of attraction and repulsion leading to more symmetrical output pulse shapes. However, again, the fine tuning of the positioning of the hinge/magnet arrangement as well as the need for moving parts make this an undesirable button.

Finally, U.S. Pat. No. 2,632,062, "Semiconductor Transducer", is predicated upon the discovery that a PN junction, when subjected to pressure, changes resistance. The patent shows in several embodiments, various elements, shaped like pencil tips, pressing upon a piezoresistive PN junction. It also shows one or more axles, in other embodiments, passing through one or more PN junctions. Pressure upon the axles subjects the PN junction to pressure, yielding a change in resistance. This reference does not satisfy the needs of elevator button. The silicon material is not resilient. The pencil tip used to stress the PN junction would not lead to a button with a long life, while the axle embodiment is quite inappropriate for use in an elevator—it does not disclose a button.

DISCLOSURE OF THE INVENTION

This invention relates to an improved elevator button assembly using a polymer film piezoresistive element to sense activation of the button. The button assembly is resistant to heat or flame induced malfunction, compact, using a minimum number of parts and readily capable of digital processing. Use of a polymer film allows for a button assembly that senses change in resistance through button movement which is nearly imperceptible to humans.

According to the preferred embodiment of the invention, an elevator button, when subjected to a force perpendicular to it, translates the resultant pressure to a piezoresistive film material which is mounted between the button and a button pressure plate such that no mechanical movement is required to register a signal indicative of the depression of the button. A potting compound with a high temperature rating is used to secure the piezoresistive material to the button and to the button pressure plate. This type of adhesive allows for a substantially fire resistant button. A compensating spring, to reduce the effects of temperature cycling of the button assembly components upon the piezoresistive element, is interposed between the polymer film piezoresistive element and the button pressure plate.

In a second embodiment, a plunger having a plunger plate remote from the button, descends down from the button toward the piezoresistive element. Perceptible motion springs, connected to the button, pressure plate and a collar, bias the plunger plate away from the piezoresistive element. The button is placed in a frustoconical housing that has catch teeth. The result is that movement of the button is perceptible to a human but the catch teeth and the housing prevent excessive force, caused by striking the button, from damaging the button assembly.

Objects of the invention include providing an elevator button which is relatively fire and heat resistant, uses no moving or mechanical contacts, and is resilient and not susceptible to being shattered easily.

These and other objects of the present invention will become more apparent in light of the detailed description of the best mode embodiment thereof, as illustrated in the accompanying drawings.

BEST MODE FOR CARRYING OUT THE INVENTION

A polymer film that exhibits a decreasing resistance with increasing force has been developed by Interlink Electronics, of Santa Barbara, Calif., United States of America. The material, marketed under the trademarks "FORCE SENSING RESISTOR" and "FSR", is described in an Interlink Electronics publication entitled, "Electrical Design Considerations for Force Sensing Resistor Technology", Applications Note IL-01, by Stuart I. Yaniger. It is known to apply this film to the exterior of robotic hands by wrapping the material around the robotic hands, DOE Technology Application Announcement 23, No. 3, "Tiny Sensor may Help Robots Handle Materials Accurately".

This material has a number of desirable characteristics which are advantageous in an elevator button assembly, namely, this material provides an output that is less sensitive to heat than piezofilm; and less sensitive to fire than piezoelectric materials; this material is both resilient and nearly paper-thin, bending like a soft plastic. The amount of deformation needed to cause a change in resistance is imperceptible to a human. The material is less susceptible to damage when compared to piezoelectric materials; its rigidity is nearer to that of a very thin, flexible plastic than to any metal.

The signal produced by the application of pressure to an "FSR" film follows the curve of the load, unlike piezoelectrics. For example, for a step function load curve, the response of a force sensing resistor is a step function. The "FSR" polymer film output is more readily converted into a signal capable of being processed through digital circuitry.

Figure 1:
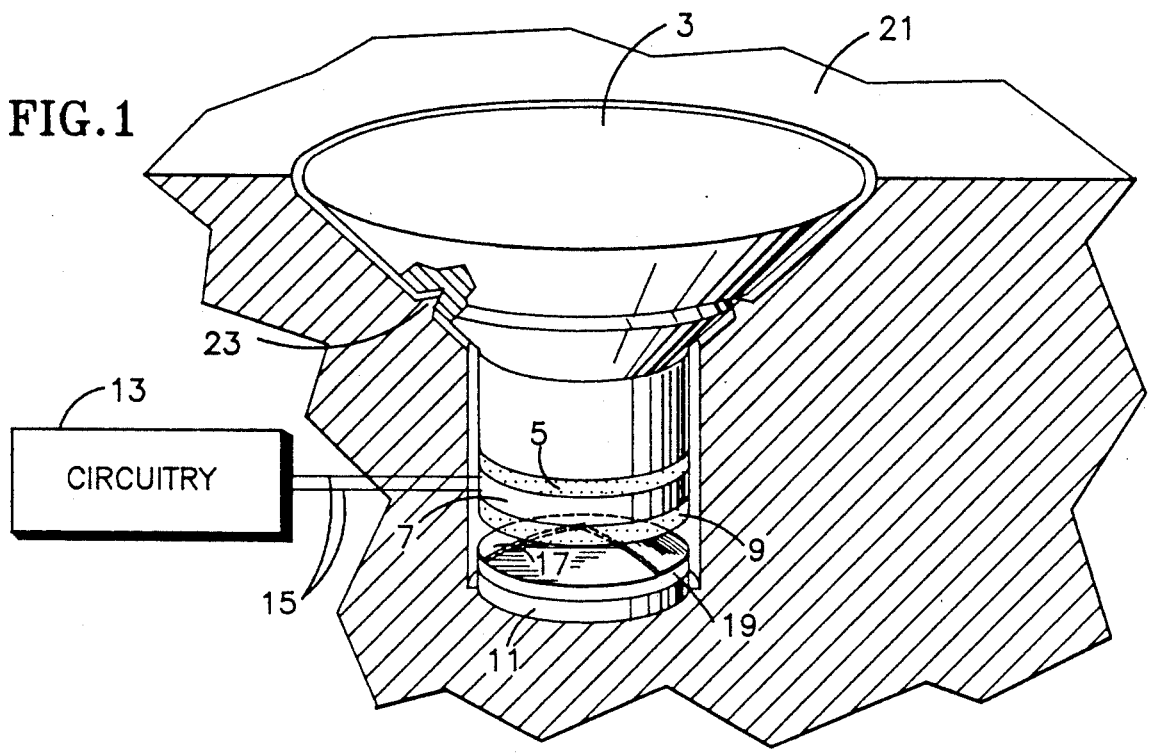
FIG. 1 is a fragmented sectional perspective view of a push-button switch embodying the present invention.

Referring to FIG. 1, the preferred embodiment, a button 3 is depressible against an adhesive 5 which in turn exerts a force on an exemplary disc-shaped piezoresistive element 7 which element is a polymer film described in the aforesaid "Electrical Design Considerations for Force Sensing Resistor ("FSR") Technology". The piezoresistive element 7 is sandwiched between first and second adhesives 5,9 so that the piezoresistive element 7 is brought to bear on a button pressure plate 11. A potting compound with a high temperature rating is preferably used as adhesives 5,9 to render the button more heat and fire resistant. Application of pressure to the piezoresistor 7 yields a signal directly proportional to force, which signal is detected by external circuitry 13 through wiring 15. Between the adhesive 9 and the button pressure plate 11, a compensating spring 17, that is a spring with a negative coefficient of expansion, may be used to compensate for thermal expansion of the button assembly elements. The spring 17 may be attached to the button pressure plate 11 and piezoresistor 7 by means of a third adhesive or potting compound 19, also having a high temperature rating.

The button requires almost no perceptible motion to register a signal and therefore is not subject to wear for that reason. The button may have a frustoconical housing 21 so that a sharp blow to the button face will be transmitted to the housing rather than the force sensing resistive material 7 although, due to the extreme resiliency of the paper-thin polymer film used as the piezoresistor 7, such a blow would do less damage to said material than to other materials. Catch teeth 23 prevent the button 3 from being pulled from its housing 21.

Figure 2:
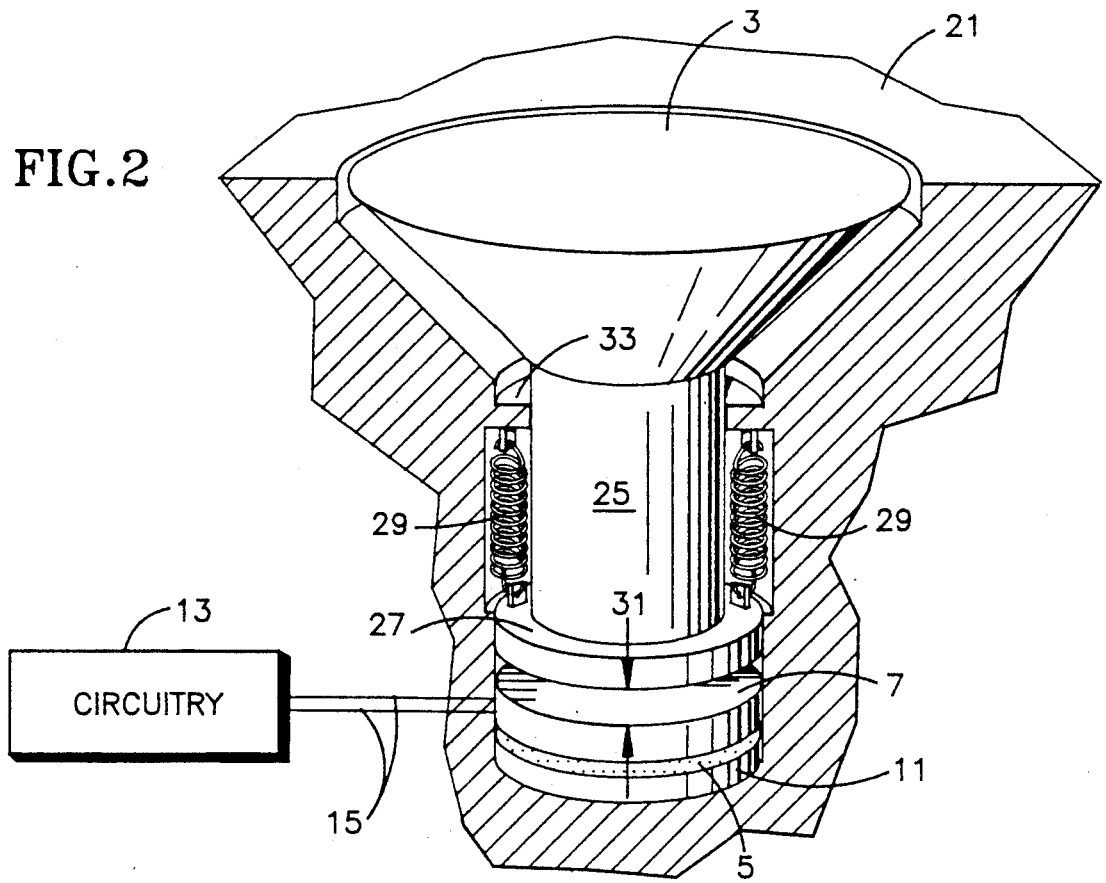
FIG. 2 is a view similar to FIG. 1 but showing and embodiment of the invention using a plunger.

Referring now to FIG. 2, there is shown a second embodiment of the invention wherein the button face does not bear directly upon the piezoresistor 7. Rather, a plunger 25 is connected to the underside of the button 3 such that movement of the button 3 causes movement of the plunger 25 which in turn causes a plunger plate 27 to bear against the piezoresistor 7. As in the prior embodiment, an adhesive or potting compound 5 may be applied to the piezoresistive material 7 in order to attach the latter to button pressure plate 11.

The embodiment shown in FIG. 2 uses perceptible motion springs 29. In some cases, it may be preferable that the button 3 exhibit perceptible motion. This would be especially true in an elevator used by blind persons who may not otherwise know that they have depressed the elevator button. A range of motion 31 is set so as to allow for human perception of the depression of the button 3. To accommodate this need, one or more perceptible motion springs 29 are employed so that depression of the button 3 does not engage the piezoresistor 7 until the button 3 has descended a predetermined distance. The perceptible motion springs 29 are connected to a collar 33 and the plunger plate 27. Compression of the piezoresistive material 7 does not occur until the plunger plate 27 has descended the range of motion 31. The plunger plate 25 prevents the button 3 from being pulled from its housing 21. If desired, the length of plunger 25 may be large enough to provide perceptible motion and yet small enough that the button 3 may not be grasped with the fingers of, for example, a vandal.

The spring or springs 29 may be coil springs, leaf springs or any type of spring desired, including a single resilient material having the characteristics of a spring. Another example of such spring means might be a closed, but compressible gas pressure chamber or pneumatic spring. Nor is it necessary to the present invention that the perceptible motion spring be connected to a collar 33. The same result could be achieved by placing a spring means between the sides of the button face and the housing.

Although the invention has been shown and described with the respect to a best mode embodiment thereof, it should be understood by those skilled in the art that the foregoing and various other changes, omissions, and additions in the form and detail thereof may be made therein without departing from the spirit and scope of the invention as defined by the appended claims.

We claim:

1. An elevator button assembly, comprising:
a button;
a button housing, for containing said button;
a polymer film piezoresistive element, for sensing the movement of said button by exhibiting a change in resistance when stressed by said button.

2. An elevator button assembly, comprising:
a button;
a button housing, for containing said button;
a polymer film piezoresistive element, for sensing the movement of said button by exhibiting a change in resistance when stressed by said button;
a button pressure plate against which said piezoresistive element comes to bear when said button moves.

3. An elevator button assembly comprising:
a button;
a button housing, for containing said button;
a polymer film piezoresistive element; and
a potting compound adjacent to said piezoresistive element, said potting compound having a high temperature rating for protecting said button assembly from excessive heat.

4. An elevator button assembly, comprising:
a button;
a button housing for containing said button;
a piezoresistive element for sensing the movement of said button by exhibiting a change in resistance when stressed by said button;
a button pressure plate against which said piezoresistive element comes to bear when said button moves; at least one compensating spring, said compensating spring having a negative temperature coefficient of expansion for compensating for the expansion of said button, button pressure plate, or piezoresistive element due to temperature cycling, said compensating spring being connected to, and between, said piezoresistive element and said button pressure plate.

5. An elevator button assembly, comprising:
a button;
a button housing for containing said button;
a polymer film piezoresistive element for sensing the movement of said button by exhibiting a change in resistance when stressed by said button;
a button pressure plate against which said piezoresistive element comes to bear when said button moves;
at least one compensating spring, said compensating spring having a negative temperature coefficient of expansion for compensating for the expansion of said button, button pressure plate, or piezoresistive element due to temperature cycling, said compensating spring being connected to, and between, said piezoresistive element and said button pressure plate;
a plunger contiguous to said button for limiting the travel of said button;
a plunger plate contiguous to said plunger at an end of said plunger remote from said button;
a collar through which said plunger may pass;
spring means, contiguous to said collar at one end of said spring means for biasing said plunger plate toward said collar;
connecting means for securing said compensating spring both to said piezoresistive element and said button pressure plate.

6. An elevator button assembly as in claim 5, wherein said connecting means is an adhesive with a high temperature rating making said button assembly heat resistant.

* * * * *